United States Patent
Khandekar et al.

(10) Patent No.: US 10,804,233 B1
(45) Date of Patent: Oct. 13, 2020

(54) WAFER-LEVEL CHIP-SCALE PACKAGE DEVICE HAVING BUMP ASSEMBLIES CONFIGURED TO MAINTAIN STANDOFF HEIGHT

(75) Inventors: Viren Khandekar, Flower Mound, TX (US); Karthik Thambidurai, Plano, TX (US); Vivek Swaminathan Sridharan, Addison, TX (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 0 days.

(21) Appl. No.: 13/287,254

(22) Filed: Nov. 2, 2011

(51) Int. Cl.
H01L 23/544 (2006.01)
H01L 23/00 (2006.01)
H01L 23/498 (2006.01)
H01L 23/31 (2006.01)

(52) U.S. Cl.
CPC .............. *H01L 24/11* (2013.01); *H01L 24/13* (2013.01); *H01L 24/14* (2013.01); *H01L 23/3114* (2013.01); *H01L 23/49816* (2013.01); *H01L 24/16* (2013.01); *H01L 2224/03828* (2013.01); *H01L 2224/0401* (2013.01)

(58) Field of Classification Search
USPC ........ 257/734, 737, 738, 741, 772, 773, 786
See application file for complete search history.

(56) References Cited

U.S. PATENT DOCUMENTS

| | | | |
|---|---|---|---|
| 5,155,301 A | 10/1992 | Mase | |
| 6,303,408 B1 | 10/2001 | Smith | |
| 6,404,476 B1 | 6/2002 | Mase | |
| 6,781,245 B2* | 8/2004 | Huang | H01L 21/4853 257/738 |
| 6,972,483 B1* | 12/2005 | Song | H01L 23/3114 257/690 |
| 7,038,144 B2 | 5/2006 | Yasuda et al. | |
| 7,338,891 B2* | 3/2008 | Jeong | 438/614 |
| 7,525,201 B2* | 4/2009 | Takahira | H01L 23/3114 257/797 |
| 2002/0100610 A1 | 8/2002 | Yasuda et al. | |
| 2003/0132519 A1 | 7/2003 | Huang | |
| 2005/0074955 A1* | 4/2005 | Goudarzi | H05K 3/3436 438/508 |
| 2005/0087885 A1 | 4/2005 | Jeong | |
| 2005/0093153 A1 | 5/2005 | Liu | |
| 2005/0133933 A1 | 6/2005 | Shen et al. | |
| 2006/0197168 A1* | 9/2006 | Naito | G01R 33/02 257/421 |
| 2006/0226545 A1* | 10/2006 | Suminoe et al. | ............. 257/738 |
| 2008/0293232 A1 | 11/2008 | Kang et al. | |

(Continued)

*Primary Examiner* — Cory W Eskridge
(74) *Attorney, Agent, or Firm* — Kevin E. West; Advent, LLP

(57) ABSTRACT

Wafer-level (chip-scale) package semiconductor devices are described that have bump assemblies configured to maintain standoff (bump) height. In an implementation, the wafer-level chip-scale package devices include an integrated circuit chip having an array of bump assemblies disposed over the integrated circuit chip. The array of bump assemblies comprises a plurality of first bump assemblies that include solder bumps composed at least substantially of a solder composition (i.e., do not include a core). The array further includes at least one second bump assembly including a solder bump having a core configured to maintain standoff height of the wafer-level package device.

12 Claims, 6 Drawing Sheets

(56) References Cited

U.S. PATENT DOCUMENTS

| | | | |
|---|---|---|---|
| 2009/0256256 A1* | 10/2009 | Meyer | H01L 24/13 257/738 |
| 2011/0186989 A1 | 8/2011 | Hsiao et al. | |
| 2011/0248398 A1 | 10/2011 | Parvarandeh et al. | |

* cited by examiner

WAFER-LEVEL CHIP-SCALE PACKAGE DEVICE HAVING BUMP ASSEMBLIES CONFIGURED TO MAINTAIN STANDOFF HEIGHT

BACKGROUND

Traditional fabrication processes used in the manufacture of semiconductor devices employ microlithography to pattern integrated circuits onto a circular wafer formed of a semiconductor, such as silicon or the like. Typically, the patterned wafers are segmented into individual integrated circuit chips, or dies, to separate the integrated circuits from one another. The individual integrated circuit chips are assembled or packaged using a variety of packaging technologies to form semiconductor devices that may be mounted to a printed circuit board.

Over the years, packaging technologies have evolved to develop smaller, cheaper, more reliable, and more environmentally-friendly packages. For example, chip-scale packaging technologies have been developed that employ direct surface mountable packages having a surface area that is no greater than 1.2 times the area of the integrated circuit chip. Wafer-level packaging is an emerging chip-scale packaging technology that encompasses a variety of techniques whereby integrated circuit chips are packaged at wafer level, prior to segmentation. Wafer-level packaging extends the wafer fabrication processes to include device interconnection and device protection processes. Consequently, wafer-level packaging streamlines the manufacturing process by allowing for the integration of wafer fabrication, packaging, testing, and burn-in processes at the wafer level.

SUMMARY

Wafer-level chip-scale package semiconductor devices are described that have bump assemblies configured to maintain standoff (bump) height. In an implementation, the wafer-level chip-scale package devices include an integrated circuit chip having an array of bump assemblies disposed over the integrated circuit chip. The array of bump assemblies comprises a plurality of first bump assemblies that include solder bumps composed at least substantially of a solder composition (i.e., solder bumps that do not include a core). The array further comprises at least one second bump assembly that includes a solder bump having a core configured to maintain standoff height of the wafer-level package device.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Figure 1A:
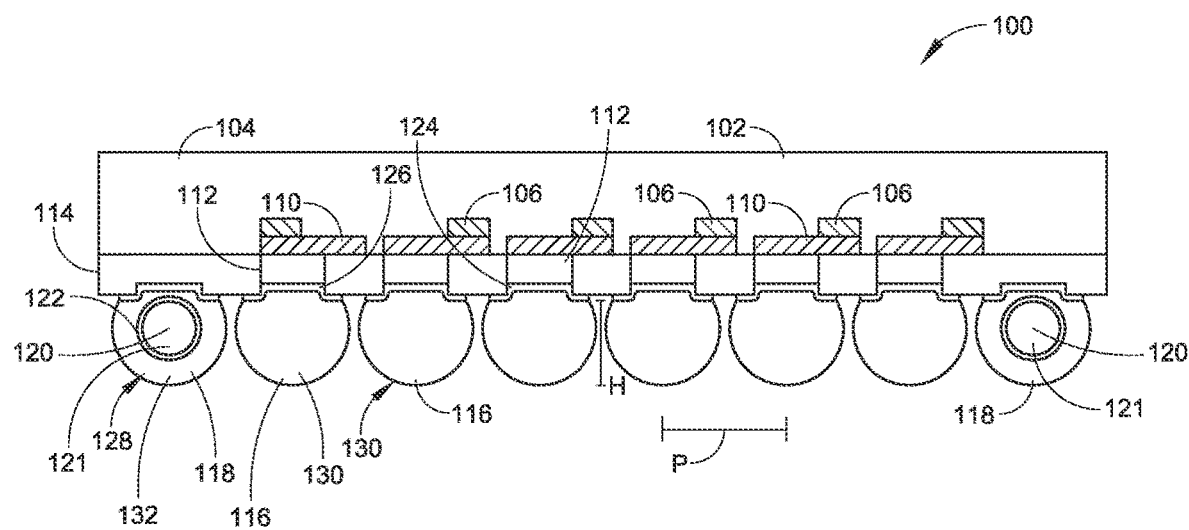
FIG. 1A is a diagrammatic partial cross-sectional side elevation view illustrating a wafer-level chip-scale package device in accordance with an example implementation of the present disclosure.

Wafer-level packaging facilitates the production of semiconductor devices that are lower in cost, have smaller form factors, and provide lower parasitic effects than devices manufactured utilizing many other packaging technologies. However, the application of wafer-level packaging techniques has heretofore been limited to use in the production of devices using small integrated circuit chips (e.g., devices with die having a surface area of less than about 25 mm$^2$). For devices employing larger chips (e.g., devices with die having a surface area of greater than about 25 mm$^2$), chip reliability and higher input/output (I/O) pin counts become an issue. Die collapse can occur during reflow resulting in wider solder joints (e.g., reducing the space between solder bumps). Moreover, simply reducing the pitch between adjacent solder bumps can result in bridging (e.g., shorting) of the adjacent solder bumps. Consequently, the pitch of the bump assemblies is made sufficiently large to prevent bridging of solder bumps, which does not allow for greater I/O pin counts.

Accordingly, techniques are described for fabricating wafer-level chip-scale package semiconductor devices having bump assemblies configured to maintain standoff height when the devices are mounted to a printed circuit board (PCB). The techniques thus facilitate the fabrication of wafer-level chip-scale package devices that employ large integrated circuit chips (e.g., devices that employ dies having a surface area of greater than about 25 mm$^2$). Such wafer-level chip-scale package devices may be employed in a variety of applications including, but not limited to: system on chip (SOC) applications, dynamic random access memory (DRAM) applications, and central processing unit (CPU) applications.

In an implementation, the wafer-level chip-scale package devices include an integrated circuit chip having an array of bump assemblies disposed over the integrated circuit chip. The array of bump assemblies comprises a plurality of first bump assemblies that include solder bumps composed at least substantially of a solder composition (i.e., solder bumps that do not include a core). The array further comprises at least one second bump assembly that includes a solder bump having a core configured to maintain standoff height of the wafer-level package device. In one or more embodiments, the second solder bump assemblies (e.g., solder bump assemblies having solder bumps including a core) may be selectively positioned proximate to (e.g., at or near) the corners of the integrated circuit chip. In other embodiments, the second solder bump assemblies may be positioned within the array (e.g., at points in the array that are selected to reduce or eliminate die collapse).

Example Implementations

FIGS. 1A through 1D illustrate a wafer-level chip-scale package device 100 in accordance with example implementations of the present disclosure. As shown, the devices 100 include an integrated circuit chip 102 comprised of a substrate 104 and one or more integrated circuits 106 formed proximate to a surface 108 of the substrate 104. A redistribution structure 110 is formed on the surface 108 over the integrated circuits 106. The redistribution structure 110 redistributes peripheral bonding pads of the integrated circuits 106 to one or more area arrays of bonding pads 112 that are deployed over the surface of the integrated circuit chip 102. The bonding pads 112 provide electrical contacts through which the integrated circuits 106 are interconnected to external components such as printed circuit boards.

The configuration of the redistribution structure 110 and/or the number and configuration of bonding pads 112 provided by the redistribution structure 110 may vary depending on the complexity and configuration of the integrated circuits 106, the size and shape of the integrated circuit chip 102, and so forth. Moreover, while FIG. 1 illustrates a device 100 that employs a Redistribution Layer ("RDL") configuration, it is understood that the device 100 described herein may also employ a Bump-On-Pad ("BOP") configuration. In such implementations, the BOP configuration may include integrated circuits 106 that are in direct electrical communication with the bonding pads 112 (e.g., integrated circuit chip 102 does not include a redistribution structure 110).

The wafer-level chip-scale package device 100 further includes a dielectric layer 114 that serves as a passivation layer for the substrate 104. As shown, the dielectric layer 114 is formed over the substrate 104, and may be comprised of any suitable dielectric material. For example, the dielectric layer 114 may comprise an oxide ($SiO_2$) material, a nitride ($Si_3N_4$) material, a benzocyclobutene (BCB) polymer material, and so forth.

Figure 1B:
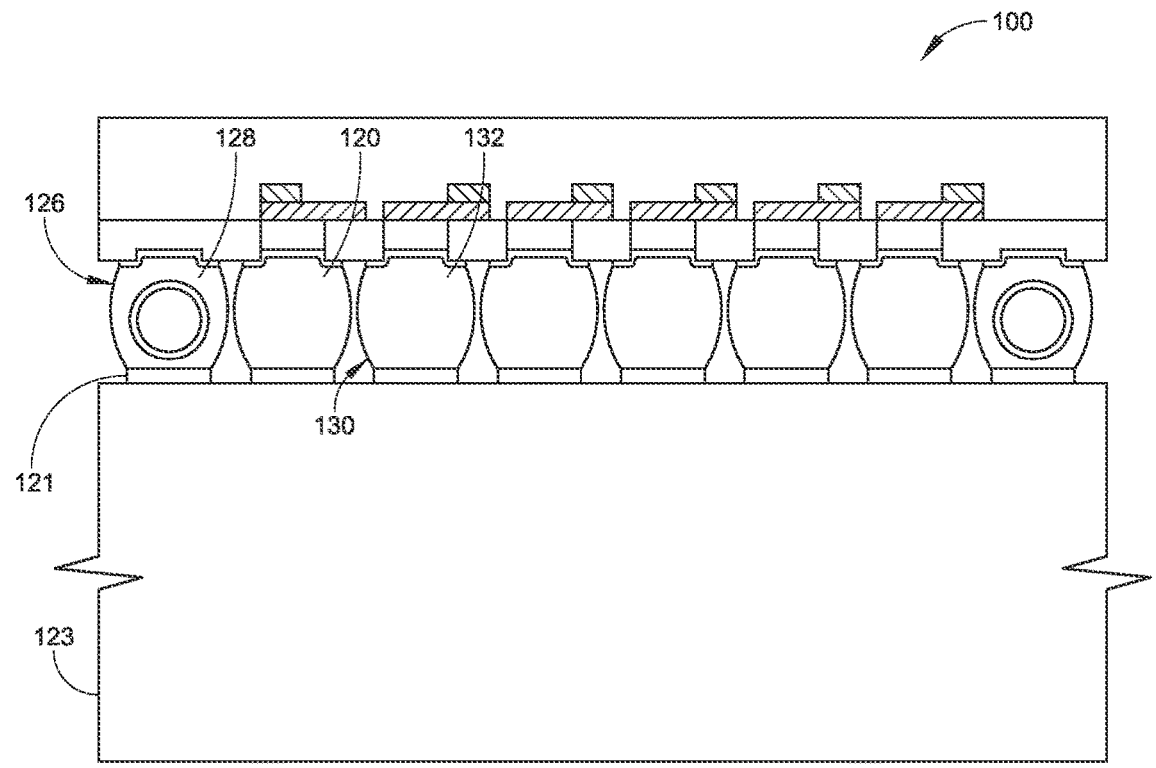
FIG. 1B is a diagrammatic partial cross-sectional elevation view illustrating the wafer-level chip-scale package devices of FIG. 1 mounted to the printed circuit board of an electronic device.

Solder bumps 116, 118 furnish mechanical and/or electrical interconnection between the bonding pads 112 and corresponding pads 121 formed on the surface of a printed circuit board 123 (see FIG. 1B). The solder bumps 116, 118 may be fabricated of a lead-free solder composition such as a Tin-Silver-Copper (Sn—Ag—Cu) alloy solder (i.e., SAC), a Tin-Silver (Sn—Ag) alloy solder, a Tin-Copper (Sn—Cu) allow solder, and so on. However, it is contemplated that Tin-Lead (PbSn) solder compositions may be used. In implementations, the solder bumps are formed from solder balls using a ball drop process. Example ball drop processes suitable for forming the solder bumps 116, 118 using wafer-level packaging techniques are described in more detail below.

As shown in FIGS. 1A through 1D, the solder bumps 116, 118 may comprise first solder bumps 116 and second solder bumps 118. The first solder bumps 116 are formed at least substantially of a solder composition, such as the solder compositions discussed herein, and thus do not include cores. In embodiments, the first solder bumps 116 may be fabricated from solder balls that have a pre-reflow diameter of about fifty microns (50 µm) to about six hundred microns (600 µm). Following reflow, the solder bumps 116 may have an aspect ratio (height to width ratio) of about 0.5:1 to about 1:1. However, it is contemplated that, depending on application requirements, the first solder bumps 116 may be fabricated from solder balls having larger or smaller pre-reflow diameters, which may have a larger or smaller aspect ratio following reflow.

As shown, the second solder bumps 118 include a core 120 that is at least substantially enclosed within the solder composition of the solder bumps 118. In one or more implementations, the core 120 may be fabricated of a resilient (elastic) material. For instance, the core 120 may comprise a plastic core 121, such as an organic plastic core fabricated of a material such as Divinylbenzene cross-linked co-polymer. The core 120 may also include a shell 122 that at least substantially surrounds and encloses the plastic core 121, and is configured to allow solder to adhere to the core 120. In embodiments, the shell 122 may be relatively rigid (hard), and may be comprised of a metal such as copper, nickel, and so forth. It is contemplated that the second solder bumps 118 may employ cores having other structures, without departing from the scope and spirit of the present disclosure.

In embodiments, the second solder bumps 118 may have a pre-reflow diameter of about fifty microns (50 µm) to about six hundred microns (600 µm). Following reflow, the solder bumps 116 may have an aspect ratio (height to width ratio) of about 0.5:1 to about 1:1. In various implementations, the diameter of the core 120 may range from about one hundred microns (100 µm) to about three hundred and fifty microns (350 µm). For example, in one implementation, the diameter ($D_C$) of the core 120 may be about one hundred and forty-eight microns (148 µm). However, it is contemplated that, depending on application requirements, the second solder bumps 118 may be fabricated from solder balls having larger or smaller pre-reflow diameters, which may have a larger or smaller aspect ratio following reflow.

Bump interfaces 124 may be applied to the bonding pads 112 of the integrated circuit chip 102 to provide a reliable interconnect boundary between the bonding pads 112 and the solder bumps 116, 118. For instance, in the wafer-level chip-scale package device 100 shown in FIGS. 1A and 1B, the bump interface 124 comprises under-bump metallization (UBM) 126 applied to the bonding pads 112 of the integrated circuit chip 102. The UBM 126 may have a variety of compositions. For example, the UBM 126 may include multiple layers of different metals (e.g., Aluminum (Al), Nickel (Ni), Copper (Cu), etc.) that function as an adhesion layer, a diffusion barrier layer, a solderable layer, an oxidation barrier layer, and so forth. However, other interface structures are (e.g., copper pillars, other UBM structures, etc.) are possible.

Viewed together, the solder bumps 116, 118 and the bump interfaces 124 comprise an array 128 of first bump assemblies 130 and second bump assemblies 132, respectively. The first bump assemblies 130 are comprised of first solder bumps 116, associated bonding pads 112, and bump interfaces 124 (e.g., UBM 126).

In implementations, the first bump assemblies 130 (e.g., solder bumps 116) are configured to provide electrical interconnection between the integrated circuit chip 102 and a printed circuit board 123. The first bump assemblies 130 may also furnish mechanical support to the wafer level chip-scale package device 100 when the device is mounted to the printed circuit board 123. The first bump assemblies 130 may be positioned within the array 128 at locations where the solder bumps 116 do not experience elevated levels of stress due to CTE mismatch, dynamic deformation, fatigue, and so on, and thus are unlikely to suffer stress related failure.

The second bump assemblies 132 (e.g., solder bumps 118) provide mechanical support of the wafer level chip scale device 100. The second bump assemblies 132, which contain cores 120, are configured to withstand stresses caused by CTE mismatch, dynamic deformation, fatigue, and so on, with a lower failure rate than the first bump assemblies 130. Thus, the second bump assemblies 132 may be employed within the array 128 in place of first bump assemblies 130 in areas of the integrated circuit chip 102 where the solder bumps 116 could experience elevated levels of stress that could cause failure (e.g., the corners 134) of the solder bumps 116.

Figure 1D:
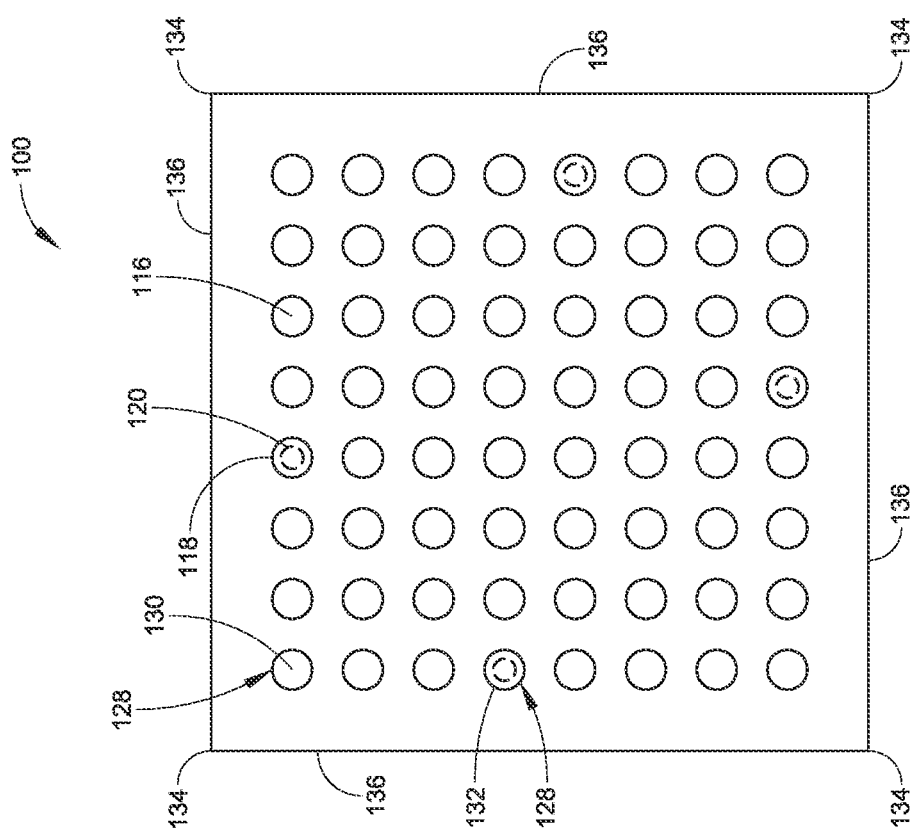
FIG. 1D is a diagrammatic top plan view of a wafer-level chip-scale package device in accordance with another example implementation of the present disclosure, wherein the solder bumps having a core are selectively disposed along the edges of the integrated circuit chip of the device.
Figure 1C:
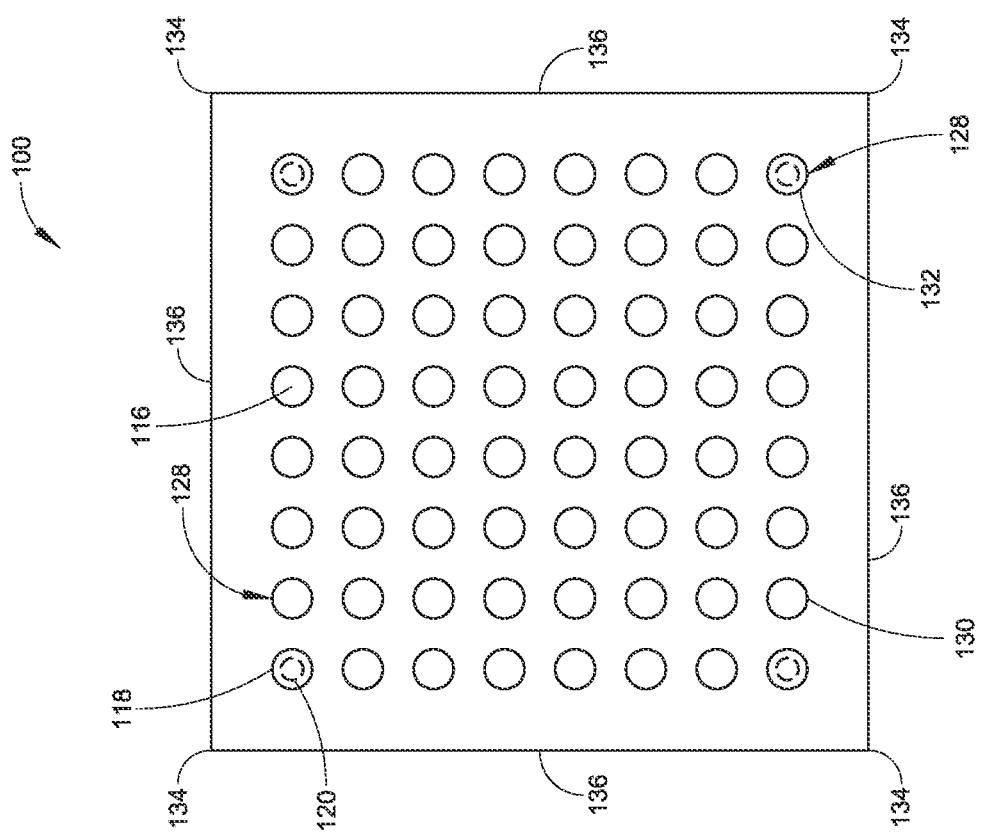
FIG. 1C is a diagrammatic top plan view of a wafer-level chip-scale package device in accordance with an example implementation of the present disclosure shown in FIG. 1A, wherein the solder bumps having a core are disposed proximate to the corners of the integrated circuit chip of the device.

The positions and arrangements of the second bump assemblies 132 may vary due to factors such as the size and shape of the integrated circuit chip 102, the design of the integrated circuit 106 formed on the chip 102, thermal cycling and drop testing requirements, and so on. Thus, the second bump assemblies 132 may be selectively disposed (e.g., positioning the solder bumps 118 over associated bonding pads 112) in areas of the integrated circuit chip 102 that are prone to higher areas of stress. For example, in the wafer-level chip-scale package devices 100 shown in FIGS. 1A, 1B, and 1C, a second bump assembly 132 is disposed proximate to (e.g., at or near) each corner 134 of the integrated circuit chip 102. In one such implementation, the devices 100 may include four (4) bump assemblies 130 with a single bump assembly 130 disposed proximate to each corner 134 of the device 100. In another such implementation, the devices 100 may include twelve (12) second bump assemblies 130, with three (3) bump assemblies 130 disposed in a triangular pattern proximate to each corner 134 (FIG. 4D illustrates a solder ball placement stencil configured for placement of second solder bump assemblies 130 in this configuration). However, a variety of other arrangements are possible depending on the configuration of the integrated circuit chip 102. In other implementations, the second bump assemblies 132 may be employed in areas proximate to edges 136 of the integrated circuit chip 102 where the solder bumps 118 of the first bump assemblies 130 may experience elevated levels of stress. For example, as shown in FIG. 1D, a single second bump assembly 132 may be arranged adjacent (e.g., nearest) to each edge 136 of the integrated circuit chip 102. Moreover, while FIGS. 1C and 1D illustrate an eight by eight (8×8) array of solder bumps 116, 118, it is understood that other arrays may be utilized.

Figure 4C:
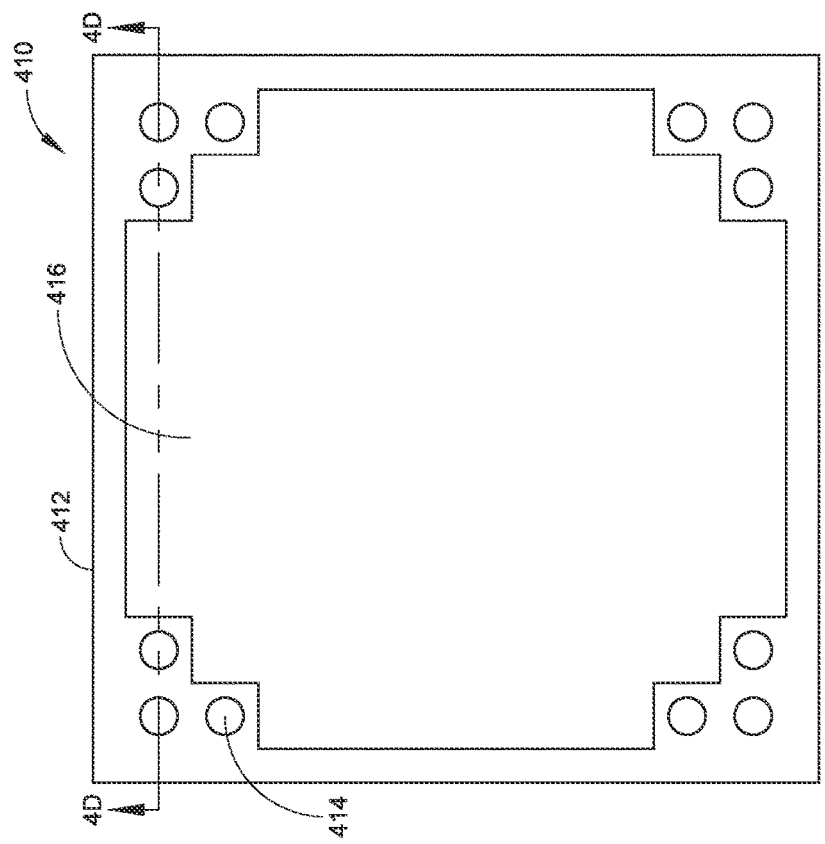
FIG. 4C is a plan view illustrating a section of a second placement stencil configured to facilitate selective placement of second solder balls over the integrated circuit chip in wafer, wherein the second placement stencil defines a groove for at least partially receiving the first solder balls when the stencil is applied to the wafer.
Figure 4D:
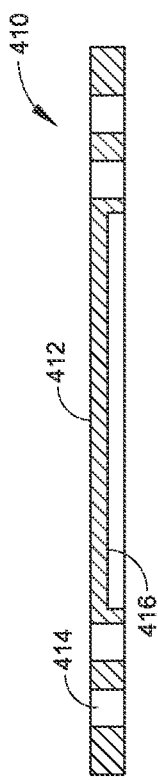
FIG. 4D is a diagrammatic partial cross-sectional side elevation view of the second placement stencil shown in FIG. 4C taken along plane 4D-4D.
Figure 4A:
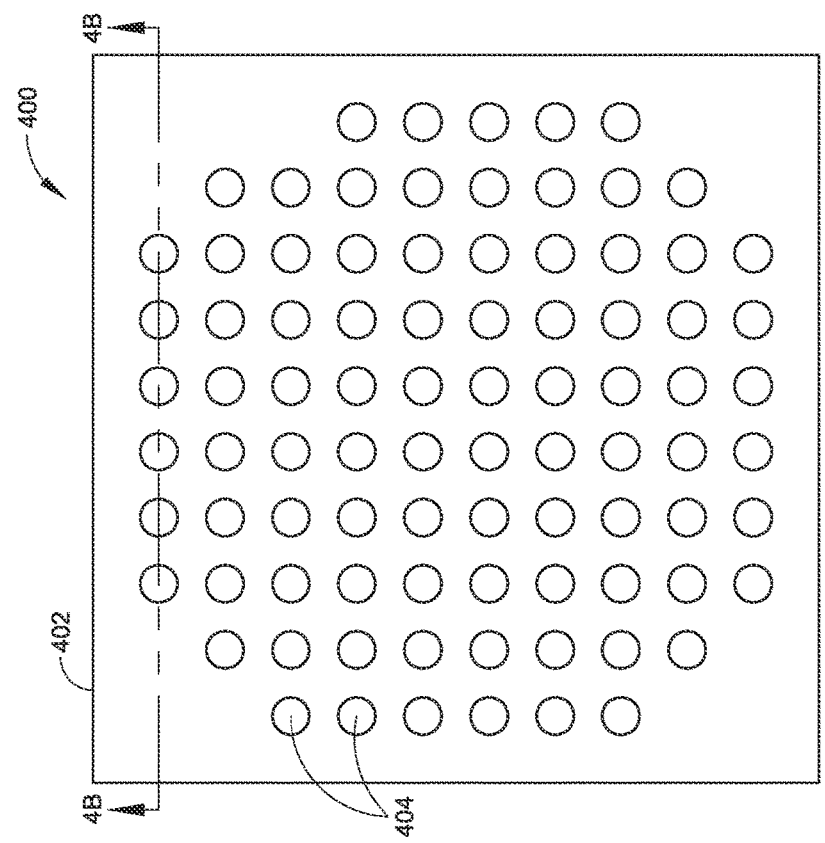
FIG. 4A is a plan view illustrating a section of a first placement stencil configured to facilitate selective placement of first solder balls over an integrated circuit chip of a device, such as the integrated circuit chip of the device shown in FIG. 1A.
Figure 4B:
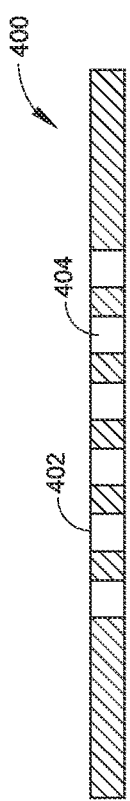
FIG. 4B is a diagrammatic partial cross-sectional side elevation view of the section of the first placement stencil shown in FIG. 4A taken along plane 4B-4B.

For example, FIGS. 4B and 4D illustrate ball placement stencils configured for use in placement of a ten by ten (10×10) array of solder bumps 116, 118.

In one or more implementations, at least some of the second bump assemblies 132 are configured to furnish only mechanical attachment of the wafer-level chip-scale package device 100 to the printed circuit board. Consequently, the second bump assemblies 132 may not be electrically interconnected with the integrated circuits 106 by the redistribution structure 110. In such implementations, the second solder bumps 118 may be selectively disposed over bonding pads 112 that are not electrically interconnected with the integrated circuits 106 (e.g., bonding pads 112 are not electrically interconnected due to design rule restrictions, etc.). However, it is contemplated that one or more of the second bump assemblies 132 may furnish electrical connection between the device 100 and the printed circuit board, such as to provide power or ground to the integrated circuit 106, and so on. In such implementation, the second bump assemblies 132 may be interconnected with the integrated circuit 106 either directly or through the redistribution structure 110.

The second bump assemblies 132 maintain standoff height of the device 10 from the printed circuit board 123 to which it is mounted, which may improve reliability in the device 100. The solder bumps 118 of the second bump assemblies 132 prevent die collapse of the device 100 and maintain standoff (bump) height for the solder bumps 116, 118, which allows for a greater number input/output (I/O) pins due to greater standoff height (H) and a pitch (P) reduction between solder bumps. In one example, a device 100 having an eighteen by eighteen (18×18) array, two hundred and fifty micron (250 µm) (pre-flow) solder bumps at three hundred and fifty micron (350 µm) pitch and interfaced with a printed circuit board decreased the diameter (D) of the solder bumps 116, 118 from about two hundred and eighty-six microns (286 µm) to two hundred and twenty microns (220 µm), increased the standoff height (H) from one hundred and forty-four microns (144 µm) to two hundred and sixteen microns (216 µm), and increased the gap (G) between each solder bump from sixty-four microns (64 µm) to one hundred and thirty microns (130 µm). In an implementation, the solder bumps 118 of the second bump assemblies 132 may have a standoff height that is approximately equal to the standoff height of the solder bump 116 of the first bump assemblies 130 after reflow.

The configuration of the bump interfaces 120 (UBM 122) of the first bump assemblies 130 and the second bump assemblies 132 may be selected to mitigate failures due to stress in the solder bumps 116, 118, electro-migration, and so on. In implementations, the first bump assemblies 130 may employ bump interfaces 120 having a first configuration, while the second bump assemblies 132 may employ bump interfaces 120 having a second configuration that is different than the first configuration. For example, the UBM 122 of the second bump assemblies 132 may differ from the UBM 122 of the first bump assemblies 130 in the number and type of layers employed by the UBM 122, the thickness of various layers of the UBM 122, the materials used in the various layers of the UBM 122, and so on.

The composition of the solder employed by the second solder bumps 118 (of the second bump assemblies 132) may be selected to further mitigate failures due to stress in the solder bumps 118, electro-migration, and so on. Moreover, the composition of the solder employed by the second solder bumps 118 may be different than the composition of the solder employed by the first solder bumps 116. Thus, the second solder bumps 118 may be fabricated of solder having a first composition, while the solder bumps 116 of the first bump assemblies 130 may be fabricated of solder having a second composition that is different than the first composition. For example, the second solder bumps 118 may be fabricated of a solder having a first composition that is more resilient and thus less susceptible to the formation of cracks, than the solder employed by the solder bumps 116 of the first bump assemblies 130, which may have a second composition selected to enhance electrical conductivity. In this manner, the rate of occurrence of stress-related failures of the solder bumps 118 may be reduced, improving the reliability of the wafer-level chip-scale package device 100. Solders used in the fabrication of the solder bumps 116, 118 may have a variety of compositions. In an example, the solder bumps 116 of the first bump assemblies 130 may be a SAC405 (95.5% Sn, 4.0% Ag, 0.5% Cu) alloy solder, while the solder bumps 118 of the second bump assemblies 132 may be a SAC305 (Sn3.0Ag0.5Cu) alloy solder. Other examples are possible.

While wafer-level chip-scale package implementations are described above by way of example, it is contemplated that the components and techniques described herein can also be employed in implementations that employ other packaging technologies (e.g., implementations that use other components and processes). For example, the present techniques may be used in implementations that employ ball grid array (BGA) technologies to furnish semiconductor packages having bump assemblies configured to maintain standoff height when the devices are mounted to a printed circuit board (PCB) in accordance with the present disclosure. In such implementations, the substrate 104 may, for example, comprise a package that contains the integrated circuit chip 102. Solder bumps 116, 118 may be deployed over a bottom surface of the package in at least substantially the same manner discussed above (e.g., solder bumps 118 may be positioned near the corners of the ball grid array package, and so on). Other implementations are possible.

Example Fabrication Processes

Figure 2:
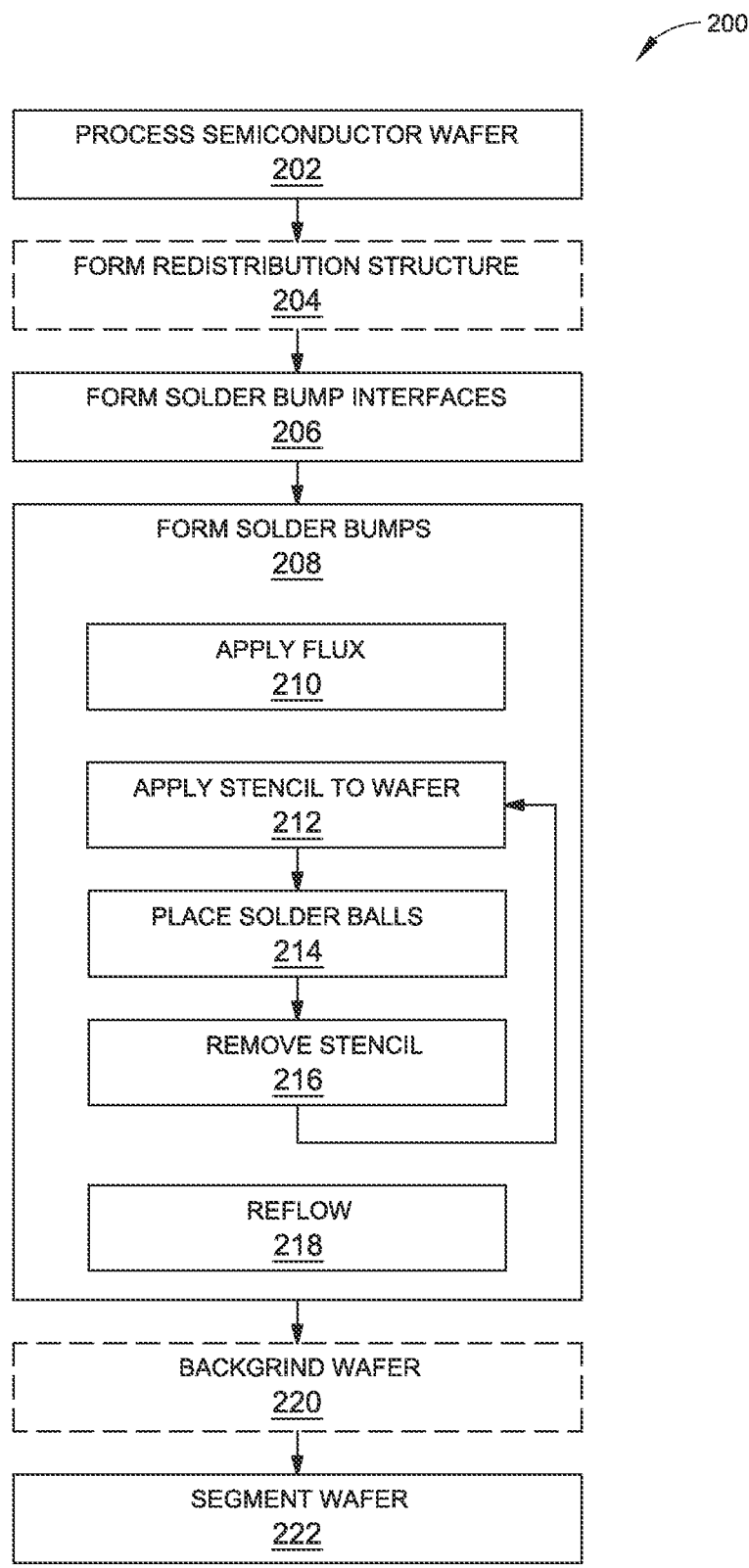
FIG. 2 is a flow diagram illustrating a process in an example implementation for fabricating wafer-level chip-scale package devices, such as the devices shown in FIGS. 1A through 1D.
Figure 3A:
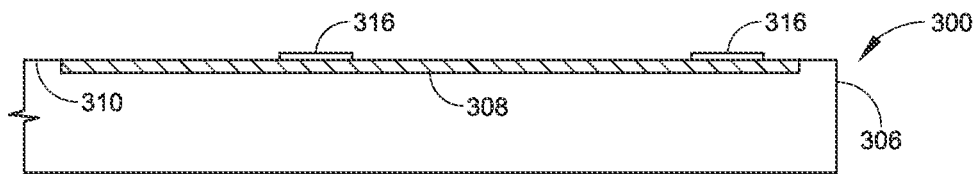
FIGS. 3A through 3H are diagrammatic partial cross-sectional side elevation views illustrating the fabrication of a wafer-level chip-scale package device, such as the device shown in FIGS. 1A through 1D, in accordance with the process shown in FIG. 2.

FIG. 2 illustrates an example process 200 that employs wafer-level packaging techniques to fabricate semiconductor devices, such as the devices 100 shown in FIGS. 1A through 1C. In the process 200 illustrated, first and second bump assemblies are formed on a semiconductor wafer prior to segmentation of the wafer into individual circuit chips (die). As shown, the semiconductor wafer is first processed (Block 202) to create integrated circuits in the surface of the wafer using front-end-of-line (FEOL) techniques. A portion of an example semiconductor wafer 300 is shown in FIGS. 3A through 3H illustrating the formation of an array 301 of bump assemblies (an example first bump assembly 302 and an example second bump assembly 304 are shown). As shown in FIG. 3A, the wafer 300, when processed, includes a substrate 306 having one or more integrated circuits 308 formed in a surface 310 of the substrate 306. The substrate 306 is configured to be segmented (diced) into a plurality of integrated circuit chips (die) 312. In the implementation illustrated, the substrate 306 is fabricated of silicon. However, it is contemplated that the substrate 306 may instead be fabricated of other semiconductor materials such as germanium, gallium arsenide, silicon carbide, and so forth.

Figure 3B:
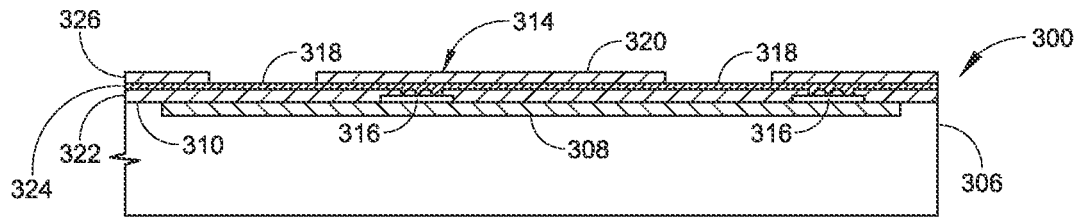
Figure 3C:
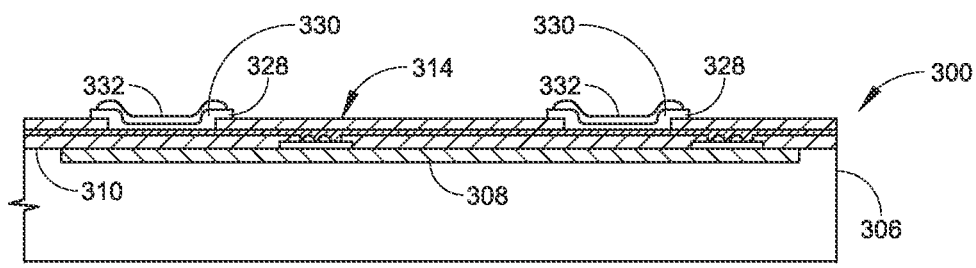

A redistribution structure is formed on the surface of the wafer (Block 204) over the integrated circuits. FIG. 3B illustrates an example redistribution structure 314. As shown, the redistribution structure 314 may have multiple layers that redistribute peripheral bonding pads 316 of the integrated circuits 308 to bonding pads 318 that are deployed over the surface 320 of the wafer 300. For example, in the implementations shown, the redistribution structure 314 is illustrated as including an isolation layer 322 formed over the integrated circuits 308 to separate the integrated circuits 308 from subsequent conductive layers. The isolation layer 322 is formed of a dielectric material such as a benzocyclobutene polymer (BCB), silicon dioxide (SiO$_2$), or the like. A redistribution layer 324 formed of a conductive material such as polysilicon, a metal such as aluminum or copper, and so on, is then applied over the isolation layer 322. The redistribution layer 324 is patterned to form the bonding pads 318 and to provide electrical interconnection of the peripheral bonding pads 316 of the integrated circuits 308 to the bonding pads 318. A passivation layer 326 is applied over the redistribution layer 324 and the isolation layer 322 to isolate the redistribution layer 324 and provide shape to the bonding pads 318. Like the isolation layer 322, the passivation layer 326 may be formed of a dielectric material such as a benzocyclobutene polymer (BCB), silicon dioxide (SiO$_2$), or the like. It will be appreciated that the redistribution structure 314 illustrated is an example of one possible redistribution structure. Other redistribution structures are possible.

Bump interfaces are next formed on the bonding pads of the redistribution structure (Block 206). In the implementation shown in FIG. 3C, the bump interfaces 328 comprise under bump metallization (UBM) 330 applied to the bonding pads 318. However, it is contemplated that the bump interfaces 328 may comprise interface structures other than UBM such as copper pillars, or the like. As noted above, the UBM 330 may include multiple layers of different metals that function as an adhesion layer, a diffusion barrier layer, a solderable layer, an oxidation barrier layer, and so forth. The under bump metallization layers may be vacuum deposited by evaporation or sputtering, or may be chemically plated.

Next, solder bumps are formed (Block 208) on the bump interfaces (e.g., on the UBM). The solder bumps may be formed in a variety of ways. In the implementations described herein, the solder bumps are formed using a ball drop process. Thus, in the following discussion, process operations characteristic of a general ball drop process are described. However, it is contemplated that the specific fabrication processes used may include other process operations without departing from the scope and spirit of the present disclosure. Moreover, it is contemplated that other techniques such as solder paste printing, evaporation, electroplating, jetting, stud bumping, and so on may be used to form the solder bumps.

As shown in FIG. 2, flux is applied (Block 210) to the bump interface (UBM). The flux 332 (FIG. 3C) removes oxidation from the surface of the interface and holds the solder (e.g., a solder ball) to the bump interface prior to reflow. The flux 332 may be applied using a variety of application techniques. For example, in one or more implementations, the flux 332 may be applied using a screen printing process. However, other flux applications processes are possible.

Figure 3D:
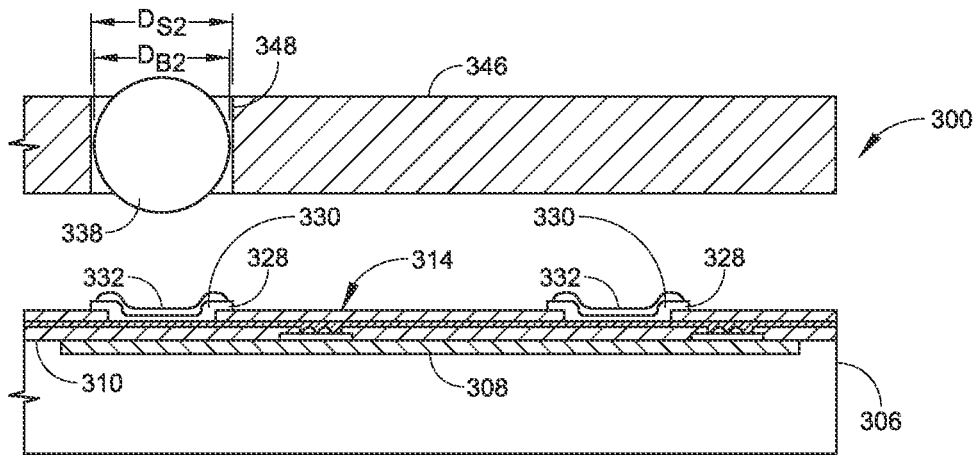
Figure 3E:
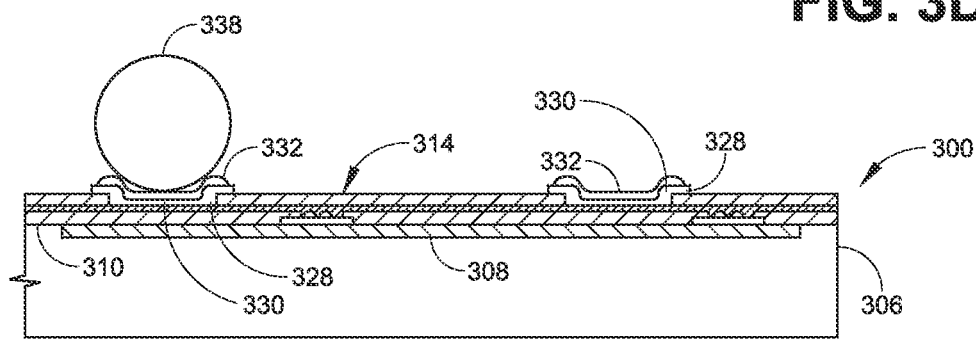
Figure 3F:
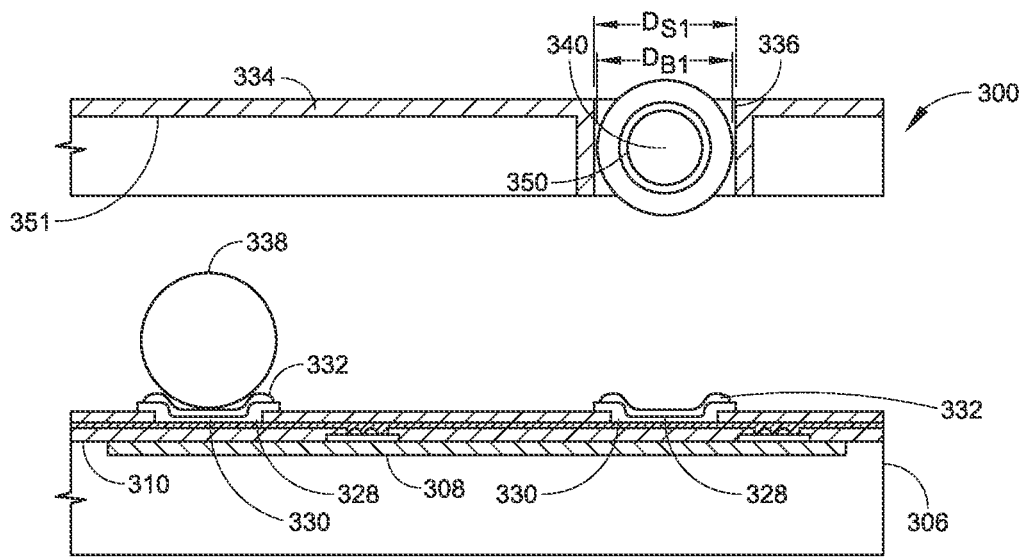
Figure 3G:
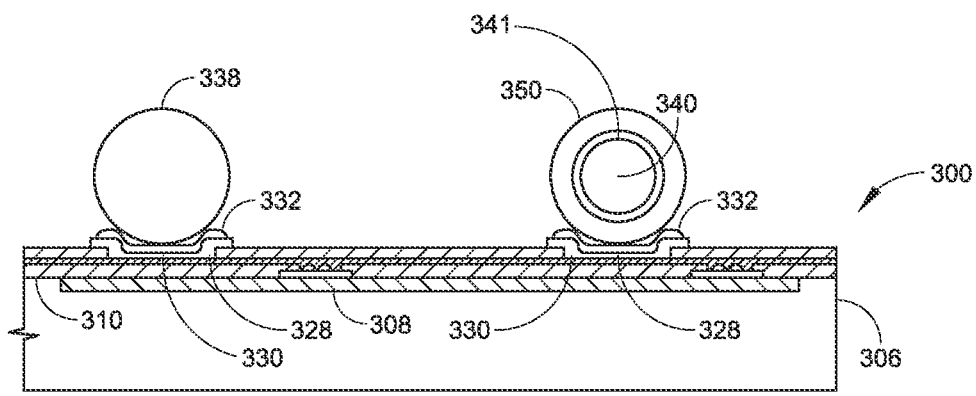
Figure 3H:
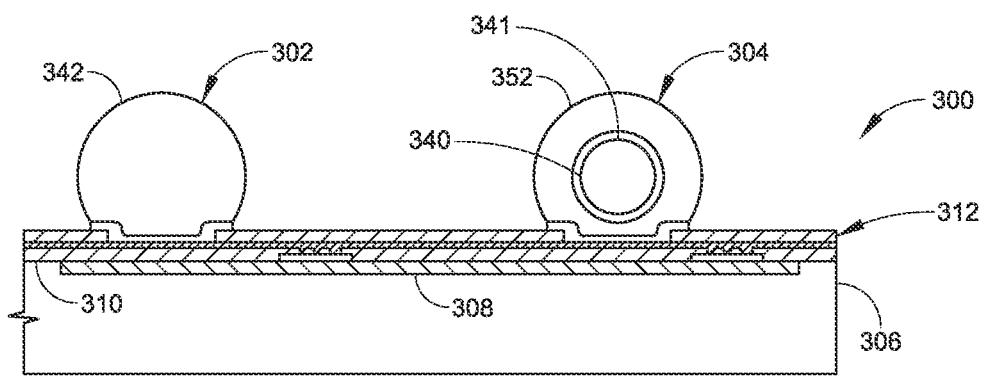

Next, a first solder ball placement stencil is applied to the wafer (Block 212) for placement of the solder balls (Block 214) that form the solder bumps of the first bump assemblies. FIG. 3D illustrates application of the first solder ball placement stencil 334 to the surface 320 of the wafer 300. The stencil 334 includes a plurality of apertures 336 that correspond to the locations of the bump interfaces 328 (e.g., UBM 330) of the first bump assemblies 302. A single ("first") solder ball (sphere) 338 is received in each aperture 336, which places the solder ball 338 onto the respective bump interface 330 where the solder ball 338 is retained by flux 332 applied to the bump interface 328. In this manner, solder balls 338 may be placed on the bump interfaces 328 of each first bump assembly 302. The solder balls 338 are generally sized to provide an appropriate volume of solder to form the solder bumps 342 of the first bump assemblies 302 (FIG. 3H). For example, the solder balls 338 may in general have diameters ($D_{B1}$) that yield a desired volume of solder following reflow. Accordingly, the apertures 336 of the first solder ball placement stencil 334 may have diameters ($D_{S1}$) that allow passage of a single solder ball 338 (e.g., $D_{S1} > D_{B1}$). In an implementation, the solder balls 338 may be positioned in areas of the integrated circuit chip 312 that may not experience elevated levels of stress compared to areas (e.g., corners 344 of the chip 312) that do experience elevated levels of stress.

Following placement of the solder balls (Block 214), the stencil is removed from the wafer (Block 216). As shown in FIG. 3E, the solder balls 338 remain affixed to the bump interfaces 328 during process operations prior to reflow by the flux 332 applied to the bump interfaces 328.

A second solder ball placement stencil is then applied to the wafer (Block 212) for placement of the solder balls (Block 214) that form the solder bumps of the second bump assemblies. FIG. 3F illustrates application of the second solder ball placement stencil 346 to the surface 322 of the wafer 300. The second solder ball placement stencil 346 includes a plurality of apertures 348 that correspond to the locations of the bump interfaces 328 (e.g., UBM 330) of the second bump assemblies 304. Again, a single ("second") solder ball (sphere) 350 is received in each aperture 348, which channels the solder ball 350 onto the respective bump interface 328 where the solder ball 350 is retained by flux 332 applied to the bump interface 328. In this manner, solder balls 350 may be applied to the bump interfaces 328 of each second bump assembly 304. The solder balls 350 include a core 340 to maintain standoff height. The core 340 may further include a shell 341 as described in the discussion of FIGS. 1A through 1D above (i.e., shell 120). In some implementations, the second solder balls 350 forming the solder bumps 352 of the second bump assemblies 304 may have a different solder composition than the first solder balls 338 forming the solder bumps 342 of the first bump assemblies 302. However, in other implementations the first and second solder balls 338, 350 may employ a common solder composition.

The solder balls 350 are generally sized to provide an appropriate volume of solder to form the solder bumps 352 of the second bump assemblies 304 (FIG. 3H). For example, the solder balls 350 may in general have diameters ($D_{B2}$) that yield a desired volume of solder following reflow. Accordingly, the apertures 348 of the second solder ball placement stencil 346 may have diameters ($D_{S2}$) that allow passage of a single solder ball 350 (e.g., $D_{S2} > D_{B2}$). As shown, the second solder ball placement stencil 346 may include one or more grooves 351 that are configured to at least partially receive the first solder balls 338 when the stencil is applied to the wafer, to prevent the already placed first solder balls 338 from being dislodged (e.g, knocked from the wafer 300, moved off of the bonding pad 316, moved on the bonding pad 316, and so forth) during placement of the second solder balls 350.

It is contemplated that the second solder balls 350 may be selectively positioned over the integrated circuit chips 312 so that the second solder balls 350 may function to maintain standoff height and prevent die collapse (e.g., during reflow). In an implementation, one or more second solder balls 350 may be placed proximate to (e.g., at or near) each corner 344 of the integrated circuit chip 312. For example, each integrated circuit chip 312 may only have four (4) second solder balls 350, each selectively positioned over the bump interfaces 328 at each corner 344 of the chip 312, while the first solder balls 338 are positioned over the remaining bump interfaces (e.g., bump interfaces 328). In another implementation, each integrated circuit chip 312 may have twelve (12) second solder balls 350, with three (3) second solder balls 350 selectively disposed proximate to each corner 344 of the chip 312. In another implementation, the solder balls 350 may be selectively positioned within the array in areas of the integrated circuit chip 312 that are subjected to greater stress due to CTE mismatch, dynamic deformation, fatigue, and so on.

The second stencil is then removed from the wafer (Block 216). As shown in FIG. 3E, the solder balls 350 remain affixed to the bump interface 328 by the flux 332 applied to the bump interfaces 328 prior to reflow.

Next, solder reflow is performed (Block 218). During reflow, the wafer is subjected to controlled heat (e.g., via a solder reflow oven), which melts the solder balls, securing the solder to the bump interfaces. FIG. 3H illustrates the wafer 300 following solder reflow. As shown, the solder balls 338, 350 have reflowed to form solder bumps 342, 352 that at least substantially extend the full surface of the bump interfaces 328, while collapsing under the influence of gravity to the lowest stress shape attainable due to surface tension of the solder.

The wafer may further be thinned by backgrinding the wafer (Block 220) using a suitable backgrinding process and segmented (e.g., diced) to separate the individual wafer-level chip-scale package devices (Block 222). In FIG. 3H, the wafer 300 is illustrated as having been thinned following a backgrinding process in preparation of being diced using a segmentation process to form devices such as the wafer-level chip-scale package devices 100 illustrated in FIGS. 1A through 1C.

In some implementations, wafer-level chip-scale package chip devices may be provided that have multiple arrays of first bump assemblies and/or second bump assemblies. In such implementations, the bump assemblies of each array may comprise solder bumps having different sizes (surface areas), pitches, solder compositions, and/or bump interface configurations than the bump assemblies of other arrays. Accordingly, as shown in FIG. 2, the process steps of applying a solder ball placement stencil onto the wafer (Block 212), placing solder balls (Block 214), and removing the stencil from the wafer (Block 216) may be repeated for each array of bump assemblies formed on the integrated circuit chip, using additional solder ball placement stencils, which may have apertures sized and/or arranged for placement of solder balls of appropriate diameter and solder composition to form the solder bumps of these bump assemblies.

Example Solder Ball Placement Stencils

FIGS. 4A through 4D illustrate portions of example first and second solder ball placement stencils 400, 410, respectively, for selectively positioning solder balls (e.g., pre-reflowed solder bumps 116, 118) over the integrated circuit chip 102. FIGS. 4A and 4B illustrate a first solder ball placement stencil 400 that includes a frame 402 and a plurality of apertures 404 configured to receive a plurality of first solder balls (e.g., solder bumps 116 after reflow). FIGS. 4C and 4D illustrate a second solder ball placement stencil 410. The second solder ball placement stencil 410 includes a frame 410 and a plurality of apertures 414 configured to receive a plurality of second solder balls (e.g., solder bumps 118 after reflow). The frame 410 defines a groove 416 that is configured to at least partially receive the first solder balls positioned by the first solder ball placement stencil 400 and to at least partially enclose the received solder balls to prevent the first solder balls from becoming dislodged during placement of the second solder balls.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A wafer-level chip-scale package device comprising:
an integrated circuit chip comprising a substrate and one or more integrated circuits formed proximate to a surface of the substrate and a redistribution structure formed on the surface over the integrated circuits, the redistribution structure electrically coupled to peripheral bonding pads of the one or more integrated circuits; and
an array of bump assemblies disposed over the integrated circuit chip, the array of bump assemblies comprising:
a first bump assembly disposed on at least one bonding pad electrically connected directly to the redistribution structure, the first bump assembly including solder bumps composed of a first solder composition, where the solder bumps are configured to provide mechanical interconnection with the surface of the substrate and electrical interconnection with the integrated circuit via the redistribution layer, the solder bumps configured without a core, the first bump assembly positioned at locations of low stress of the integrated circuit chip;
at least one second bump assembly disposed on at least one non-electrically connected bonding pad, the second bump assembly including at least one non-electrically connected solder bump fabricated of a second solder composition different than the first solder composition and having a core including a polymer, the at least one non-electrically connected solder bump configured to maintain standoff height of the wafer-level package device, wherein the at least one non-electrically connected solder bump is disposed proximate to at least one corner of the integrated circuit chip and the first bump assembly includes the solder bumps not included in the second bump assembly, and wherein the second bump assembly is positioned within the array at locations of elevated stress; and
a dielectric layer disposed directly on the surface of the integrated circuit chip over the redistribution structure, the dielectric layer having at least one opening through which the at least one non-electrically connected solder bump is disposed on the at least one bonding pad, the at least one non-electrically connected bonding pad disposed on the dielectric layer so that the dielectric layer extends between the at least one non-electrically connected bonding pad and the substrate.

2. The wafer-level chip-scale package device as recited in claim 1, wherein the core comprises an organic plastic.

3. The wafer-level chip-scale package device as recited in claim 2, wherein the core comprises a divinylbenzene cross-linked co-polymer layer.

4. The wafer-level chip-scale package device as recited in claim 1, wherein the core has a diameter and the diameter of the core ranges from about 100 μm to about 350 μm.

5. The wafer-level chip-scale package device as recited in claim 1, wherein the bump assemblies comprise bump interfaces configured to furnish an interface boundary between the solder bumps and bonding pads.

6. The wafer-level chip-scale package device as recited in claim 5, wherein the bump interfaces comprise under bump metallization (UBM).

7. An electronic device comprising:
a printed circuit board; and
a wafer-level package device, the wafer-level package device comprising:
an integrated circuit chip comprising a substrate and one or more integrated circuits formed proximate to a surface of the substrate and a redistribution structure formed on the surface over the integrated circuits, the redistribution structure electrically coupled to peripheral bonding pads of the one or more integrated circuits; the integrated circuit chip having
an array of bump assemblies disposed over the integrated circuit chip, the array of bump assemblies comprising
a first bump assembly disposed on at least one bonding pad electrically connected directly to the redistribution structure, the first bump assembly including solder bumps composed of a solder composition, the solder bumps configured to provide mechanical interconnection with the surface of the substrate and electrical interconnection with the integrated circuit via the redistribution layer, the solder bumps configured without a core, the first bump assembly positioned at locations of low stress;
at least one second bump assembly disposed on at least one non-electrically connected bonding pad, the second bump assembly including at least one non-electrically connected solder bump fabricated of a second solder composition different than the first composition and having a core including a polymer, the at least one non-electrically connected solder bump configured to maintain standoff height of the wafer-level package device, wherein the at least one non-electrically connected solder bump is disposed proximate to at least one corner of the integrated circuit chip, and the first bump assembly includes the solder bumps not included in the second bump assembly, and wherein the second bump assembly is positioned within the array at locations of elevated stress; and
a dielectric layer disposed directly on the surface of the integrated circuit chip over the redistribution structure, the dielectric layer having at least one opening through which the at least one non-electrically connected solder bump is disposed on the at least one bonding pad, the at least one non-electrically connected bonding pad disposed on the dielectric layer so that the dielectric layer extends between the at least one non-electrically connected bonding pad and the substrate.

8. The electronic device as recited in claim 7, wherein the core comprises an organic plastic.

9. The electronic device as recited in claim 8, wherein the core comprises a divinylbenzene cross-linked co-polymer layer.

10. The electronic device as recited in claim 7, wherein the core has a diameter and the diameter of the core ranges from about 100 μm to about 350 μm.

11. The electronic device as recited in claim 7, wherein the bump assemblies comprise bump interfaces configured to provide an interface boundary between the solder bumps and bonding pads.

12. The electronic device as recited in claim 11, wherein the bump interfaces comprise under bump metallization (UBM).

\* \* \* \* \*